United States Patent
Mattheis

(10) Patent No.: US 8,179,130 B2
(45) Date of Patent: May 15, 2012

(54) MAGNETIC REVOLUTION COUNTER

(75) Inventor: Roland Mattheis, Jena (DE)

(73) Assignee: Horst Siedle GmbH & Co. KG, Furtwangen (DE)

( * ) Notice: Subject to any disclaimer, the term of this patent is extended or adjusted under 35 U.S.C. 154(b) by 257 days.

(21) Appl. No.: 12/675,653

(22) PCT Filed: Aug. 21, 2008

(86) PCT No.: PCT/EP2008/006870
§ 371 (c)(1),
(2), (4) Date: Feb. 26, 2010

(87) PCT Pub. No.: WO2009/027046
PCT Pub. Date: Mar. 5, 2009

(65) Prior Publication Data
US 2010/0301842 A1    Dec. 2, 2010

(30) Foreign Application Priority Data

Aug. 27, 2007 (DE) .......................... 10 2007 040 971

(51) Int. Cl.
*G01B 7/30* (2006.01)
*G01R 33/09* (2006.01)

(52) U.S. Cl. ............... 324/207.25; 324/252; 324/207.21

(58) Field of Classification Search ............ 324/207.21, 324/207.25, 252
See application file for complete search history.

(56) References Cited

U.S. PATENT DOCUMENTS
2007/0030718 A1   2/2007   Cowburn
2007/0047156 A1   3/2007   Cowburn et al.

FOREIGN PATENT DOCUMENTS
EP   0 980 805   2/2000
EP   1 740 909   6/2007

OTHER PUBLICATIONS

Jun. 14, 2002 "Submicrometer Ferromagnetic Not Gate and Shift Register" Allwood D. A. et al. Science, American Association for the Advancement of Science vol. 296 pp. 2003-2006.

*Primary Examiner* — Bot Ledynh
(74) *Attorney, Agent, or Firm* — Jordan and Hamburg LLP

(57) ABSTRACT

A magnetic revolution counter for the unambiguous determination of a definable number of revolutions of a rotating element to be determined. The aim of creating such a revolution counter allowing a determination of any arbitrarily definable number of revolutions, for example up to values of N>4000 or more as defined, and enabling a cost-effective and small design, is achieved in that a plurality of sensor elements (30a to 30e) are provided, which are formed by closed loops having magnetic domains attached and guiding the same, containing at least one ferromagnetic, respectively soft magnetic, layer. The loops have tapered protuberances directed toward the loop interior, wherein the number of protuberances provided per loop is determined in a defined manner deviating from loop to loop, and electric contact arrangements are provided, which allow the detection of any changes in the electric resistance of predetermined loop sections after a completed change of location of magnetic domains due to the effect of the outer rotating magnetic field in predetermined loop sections, and wherein the said resistance values can be supplied to an analysis unit for the purpose of allocating the number of revolutions of the rotating element.

34 Claims, 13 Drawing Sheets

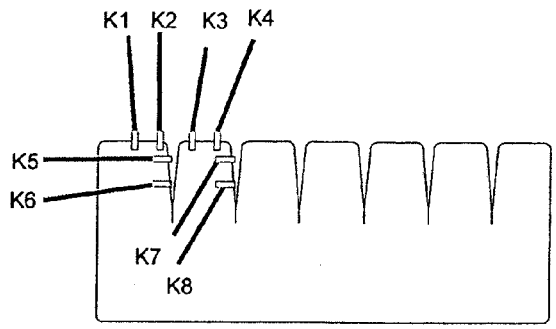
Fig. 11a
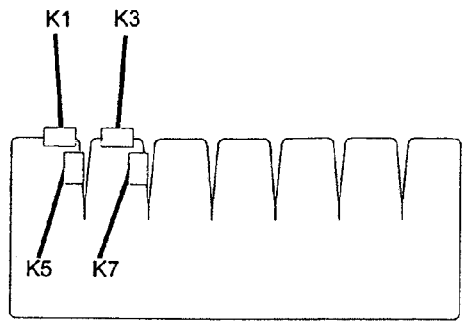
Fig. 11b
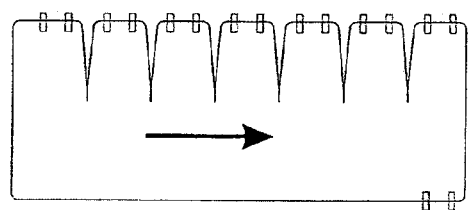
Fig. 11c1
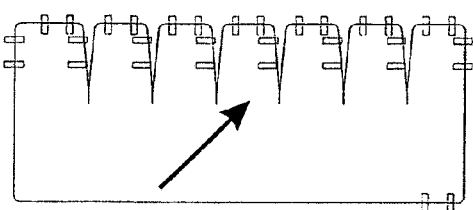
Fig. 11d1
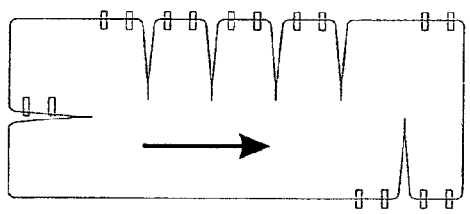
Fig. 11c2
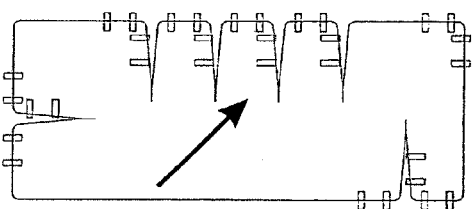
Fig. 11d2
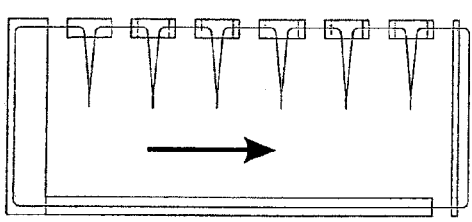
Fig. 11c3
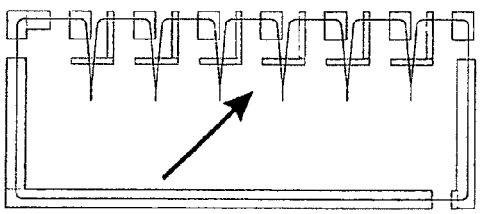
Fig. 11d3
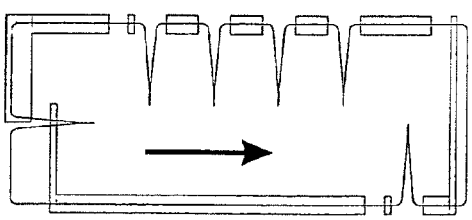
Fig. 11c4
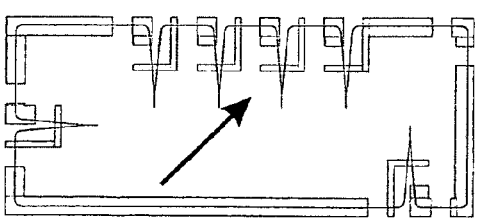
Fig. 11d4

MAGNETIC REVOLUTION COUNTER

BACKGROUND OF THE INVENTION

The invention relates to a magnetic revolution counter for unambiguous determination of a pre-specifiable number of revolutions to be determined for a rotating element that can be used advantageously in numerous engineering fields, especially in automotive engineering.

Sensors for determining an angular position according to various physical principles are widespread. It is common to them that the sensor signal is periodic after 360°, i.e. that the sensor cannot differentiate between 10° and 370°. Therefore, for tasks in which the angle must be determined beyond 360°, such as is the case e.g. with the steering wheel in an automobile, such sensors are combined with another sensor that is able to detect the number of revolutions. It is then possible to differentiate between 10° and 370° using a combination with a revolution counter. Solutions for determining the number of revolutions are known in which the number of revolutions (for instance between 1 . . . 5) can be suggested mechanically using the course of a spiral having N spiral arms. Other solutions use mechanical gears connected to two angle sensors. The angle can be determined, even e.g. from 0 to 5-360°, from knowing the structure of the gear and the angular position of two magnets that are connected to the various wheels of the gear. Common to all of these solutions is that they require a mechanical element, that is, they are not contactless and are therefore not wear-free. However, a contact-free solution is required for many applications, particularly in an automobile. This contact-free solution could be created in that the angular position is determined at every point in time (continuously) and in this manner it is possible to differentiate a transition of 359° to 360° from angle 0°. This requires that the sensor and an associated memory element be continuously supplied with energy. This conflicts with the automotive engineering requirement that determining the absolute angle in the range of for example, 0° to for instance 5-360° must be successful even if e.g. the onboard electronics are disconnected from the battery.

The Posital Company developed contact-free counting of the number of revolutions that satisfies these requirements in principle (Company announcement: "Kraftwerk im Encoder . . . " [Power Source in the Encoder . . . ], www.posital.com). In this case, a Hall sensor is used for determining the angle (0-360°). The number of revolutions is measured there using a so-called Wiegand wire. This wire has special magnetic properties that ensure that after every revolution, due to the sudden movement of a magnetic domain wall through a wire that is a few millimeters long, there is a brief but sufficiently intense voltage pulse that can be inscribed in a FeRAM (ferroelectric random access memory), even without the FeRAM being connected to the battery. This solution thus satisfies the requirement for determining the number of revolutions in a wear-free and contact-free manner and also counts revolutions up to the maximum storage capacity of the FeRAM used without the current supply being applied. However, the automobile industry rejects this type of solution because cost-effective production and packaging is not possible due to the macroscopic size of the Wiegand wire and because there are problems with electromagnetic compatibility due to the high ohmic input of the FeRAMs.

Another sensor element for counting revolutions that satisfies the aforesaid requirements is known from EP 1 740 909 B1 (WO 2005/106395). This sensor element is in the shape of an extended spiral having N windings and comprises a stack of layers that has the "giant magneto-resistance effect" (GMR). The GMR stratified system in this sensor element essentially comprises a hard magnetic layer, which defines the reference direction, and a soft magnetic layer, these being separated by a non-magnetic intermediate layer. The outer rotating magnetic field to be detected is strong enough to change the magnetization direction of the soft magnetic layer due to the movement of the domain walls, but it is too weak to change the magnetization direction of the hard magnetic layer, which runs parallel to the straight sections of the extended spiral. The sensor element thus reacts to a rotating magnetic field with a change in resistance, whole and half revolutions being registered in the form of 2N+1 resistance values within the countable range of 0 to N revolutions. Each resistance value is therefore bijectively assigned to a half integer or whole integer revolution value. The magnetic structure remains unchanged if the magnetic field does not rotate. Given rotation, the magnetization directions change, regardless of whether the resistance value is read out or not. This means that the system even registers all changes in the rotating magnetic field when it has no current or power, and a current supply is needed only for read-out, that is, for determining the resistance.

One disadvantage of such an arrangement is that, due to the memory geometry used, each revolution requires a complete spiral winding, and the spiral must be very large geometrically when counting a large number of revolutions. This means that the probability increases that defects that occur during the manufacture of the spiral will lead to failure and thus to a reduction in the yield. In addition, the chip surface area increases in size, and thus the costs for such a sensor also increase. Moreover, when there is a large number of spiral windings, the design provided in EP 1 740 909 B1 automatically leads to problems in determining the number of revolutions. The usable swing in voltage, which initially results from one revolution, is scaled at 1/number of spiral windings. This swing in voltage is clearly too small for a reliable evaluation for N> to >>10. One alternative, which is provided in the aforesaid patent, does permit the full magneto-resistance swing at higher rates of revolution, but still has the disadvantage of a long spiral, and the advantage of the large swing is offset in that, instead of two electrical contacts, all spiral parts that form an unclosed circuit are provided with four electrical contacts and must be read out and processed electrically. When N=100, this is four hundred contacts, and thus the circuitry is very complex.

In addition to the attempts described in the foregoing to develop revolution counters based on moving domain walls, there are also proposals for creating a magnetic logic device using moving domain walls, even if these proposals are in a search field that is not as closely related to the invention. In this case, magnetic domains are moved by closed or branching magnetic strips such that logical functions such as AND, NOT, and XOR can be created, in addition to intersections and branches. Thus, in Science Vol. 296, 14 Jun. 2002, pages 2003-2006, Allwood et al. propose a sub-µm ferro-magnetic NOT gate and shift register in which the logical information can be inscribed in the logical construct using locally flowing currents and can be read out again only by means of a TMR effect. In this publication, domain walls are moved by rotating magnetic fields that act as the clock for the magnetic logic device. US patent 2007/0030718 A1 by these authors describes the use of such a magnetic logic device in which the magnetic domain walls are moved using electrical current pulses. The same authors provide another proposal for constructing a magnetic memory (US 2007/0047156 A1) using magnetic domains. For this, the identical loop-like structures described in the foregoing are placed above one another, with the same number of cusps that are required for attaining the maximum storage capacity sought in the foregoing. Each structure comprises a loop of a magnetic material that includes cusp-shaped protuberances that protrude into the interior of the loop. Only one of the cusps that projects into the interior is elongated and, in a special embodiment, has a geometry that differs in its width from the other cusps. The information is inscribed in the memory using this cusp by generating a magnetic domain. Each cusp has a branch that leads outward, and disposed on its end is a magneto-resistive element for reading out the information. A rotating magnetic field that the loops detect homogeneously acts as clock and power supply for transporting the domains and in a special embodiment acts as serial data channel. The basic principal of this arrangement is variable generation of domains whose number equals the information specifically to be stored.

The object of the present invention is to create a magnetic sensor system for a revolution counter, which magnetic sensor system permits any desired pre-specifiable number of revolutions to be determined, for instance up to values of N>4000 or pre-specifiably more, and that thus if desired goes far beyond previously known solutions and that at the same time enables a cost-effective and structurally small embodiment that does not suffer from the disadvantages of the prior art. In addition, the proposed solution should overcome significant disadvantages of prior proposed solutions, specifically the large number of contacts (see EP 1 740 909 B1) (at least 4·N, where N is the number of countable revolutions), which number thus increases linearly with the number of the desired count of revolutions, and thus when determining 256 revolutions has 1000 contacts, and the long length of the spiral (2·N·1) where 1 is the longitudinal extension (typically 200 μm) of the spiral, as depicted in the aforesaid EP document.

SUMMARY OF THE INVENTION

This object is attained in accordance with the essence of the invention, wherein, depending on the number of revolutions to be measured for an element to be detected (for instance a shaft) that is provided with a magnet system, the magnetic field of which permits the detection of all provided sensor elements, a plurality of such elements is provided. The sensor elements are formed by closed loops that are covered by magnetic domains and that guide them, which loops include at least one ferromagnetic and one soft magnetic layer, said loops having tapered protuberances oriented into the interior of the loop, the number of protuberances provided per loop being defined and varying from loop to loop. Electrical contact arrangements are provided on the loops, which contact arrangements permit the changes in the electrical resistance of pre-specifiable loop segments to be determined after magnetic domains have changed location due to the effect of the outer rotating magnetic field of the magnet system in the pre-specified loop segments, and it being possible to supply these resistance values to an evaluation unit for the purpose of correlating the number of revolutions of the rotating element.

The basic idea of the present invention is based on the fact that every revolution of the object to be monitored is linked to a 360° revolution of a magnetic field at the site of a revolution counter and that this 360° revolution of the magnetic field leads to a change in the position of magnetic domains that move in an inventive arrangement of defined, different loops having tapered protuberances oriented into the interior of the loop. In a binary arrangement, as is described in greater detail below, each loop includes as many adjacent domains as revolutions that this loop is intended to count. Thus, in each embodiment, a fixed and defined pre-specifiable number of domains per loop is to be inscribed that then remains the same throughout the service life of the revolution counter or until it is reformatted, even if the entire arrangement is without current.

The measuring tasks underlying the invention and thus the use of the proposed revolution counter are used in two basic configurations. Either the number of revolutions of a shaft that is accessible from the side are to be determined (decentral arrangement or hollow shaft sensor arrangement) or the sensor may be placed at the end of the shaft (central arrangement).

The following exemplary embodiments and figures shall be used to explain the foregoing and the invention in greater detail.

BRIEF DESCRIPTION OF THE DRAWINGS

FIG. 11a depicts an exemplary contact arrangement, with some detail, for a coprime loop embodiment using a GMR layer system;

FIG. 11b depicts an example of a contact arrangement, with some detail, for a coprime loop embodiment using a TMR layer system;

FIG. 11c1-11c4 depict more complete variants of how the contacts are attached to a special loop without hysteresis suppression when using a GMR layer system;

FIG. 11d1-11d4 depict more complete variants of how the contacts are attached to a special loop with hysteresis suppression when using a GMR layer system;

DETAILED DESCRIPTION OF THE INVENTION

Figure 1A:
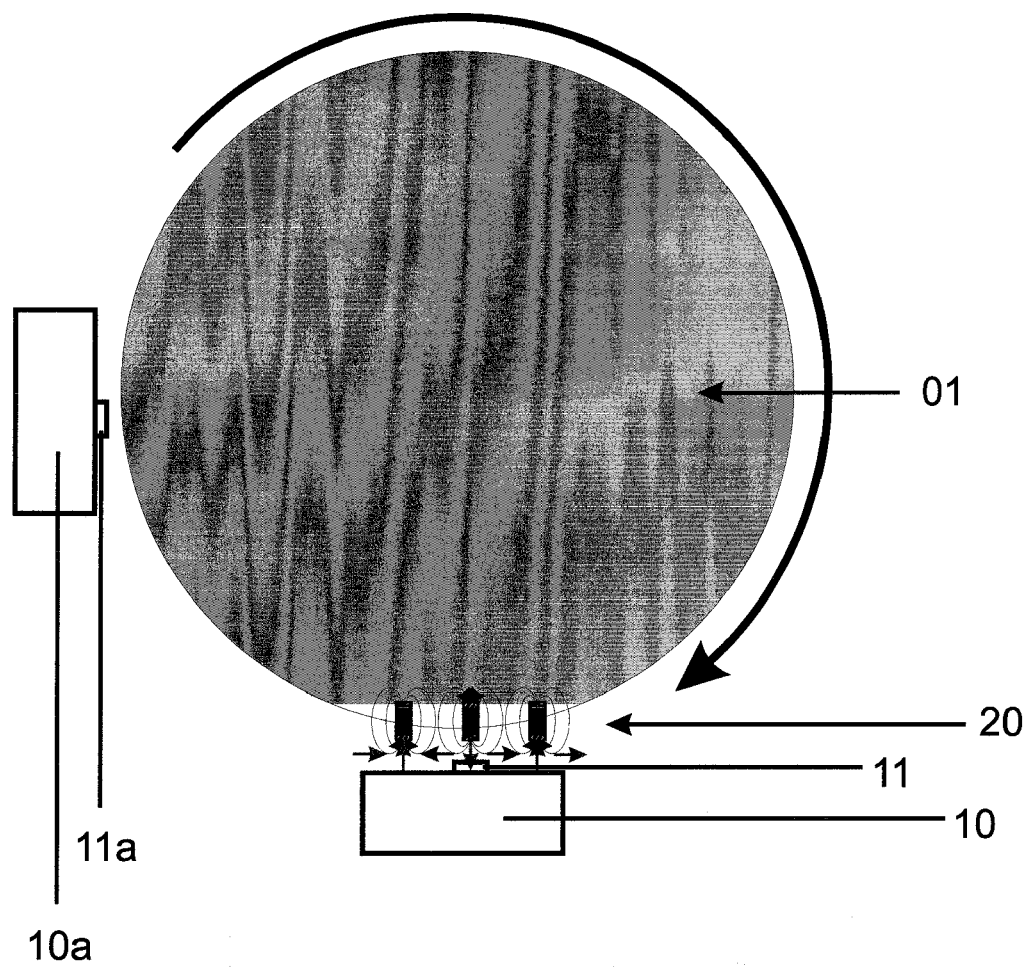
FIG. 1a illustrates the basic principle of a de-central sensor arrangement (hollow shaft sensor)
Figure 1B:
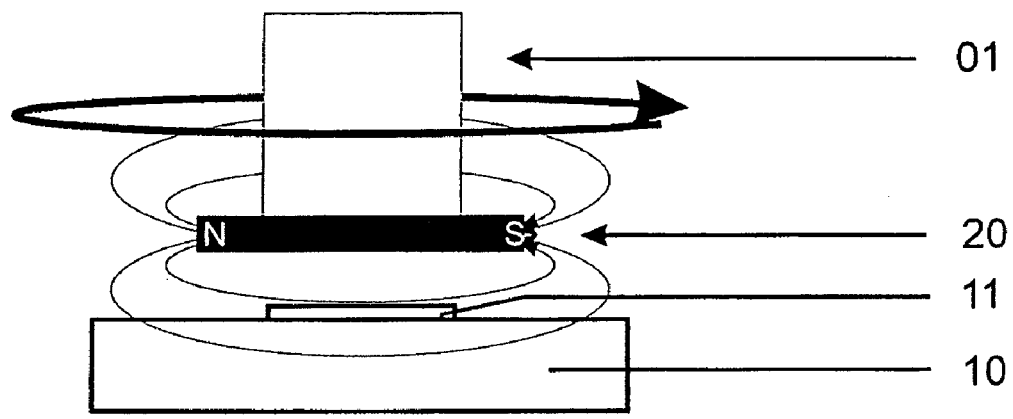
FIG. 1b illustrates the basic principle of a central sensor arrangement.

FIGS. 1a and 1b depict two basic arrangements in which the inventive revolution counter that is described in greater detail below can be used. FIG. 1a depicts a cross-section through an entire system with a de-central arrangement (hollow shaft sensor arrangement), comprising a shaft 01 with a magnet system 20 that is attached to the circumference and that includes an Si substrate 10 and 10a (advantageously also including an evaluation unit), on which is disposed an inventive revolution counter 11 or 11a. Acting from the outside at the site of the revolution counter 11 is a magnetic field, here in the form of a permanent magnet combination 20 that when it passes produces a 360° revolution in the direction of the magnetic field at the site of the revolution counter 11. The revolution counters 11 and 11a are arranged geometrically such that the magnetic field for the magnets 20 can always act only on one of the two. In this case, when the shaft 01 rotates, a plurality of permanent magnets being disposed on its circumference at a location in the example, the revolution counter 11 experiences a 360° revolution of a magnetic field at the site of the revolution counter 11. In this case the sensor is only exposed to the magnetic field across a small angular area. Since the condition of the domains, which are described in greater detail below, changes in this angular area, this angular area must be "blocked" during the measurement. This can happen in that a second sensor 11a having an evaluation unit is attached such that whenever the shaft 01 rotates, only one revolution counter is exposed to the rotating magnetic field. Since, in accordance with the known prior art, revolution counters are fundamentally operated connected to an angular sensor, which is not depicted in greater detail here, it is possible to know the site of the rotating magnetic field from the signal of the angular sensor and thus to know which of the revolution counters is supplying a valid or invalid signal, i.e., that only the signals from the revolution counter that is disposed in the moving magnetic field is read.

In an embodiment using a second principle and mentioned in the foregoing, a permanent magnet 20 is attached to the end face of a shaft 01. FIG. 1b depicts a cross-section through an entire system that has a central arrangement and that comprises a Si substrate, advantageously with an evaluation unit 10 on which the inventive revolution counter 11 is disposed. A magnetic field of a permanent magnet 20 that is disposed on the end of the shaft 01 acts from outside at the site of the sensor 11, the permanent magnet 20 being embodied such that the entire revolution counter is covered by the aforesaid magnetic field, as the field lines in the example are intended to indicate. When the shaft 01 rotates 360°, the revolution counter 11 also experiences a magnetic field that rotates 360°. In this embodiment, as well, there are angular areas in which the inscribed domain configuration described below is subjected to a change and then supplies invalid information about the number of revolutions. However, if this area is less than 90° per half revolution, then for this configuration a second inventive revolution counter that is not depicted in FIG. 1b and that is arranged on the Si substrate rotated 90° with respect to the sensor 11 can ensure that a valid signal is always available from one of the two revolution counters. Using a normal angular sensor in accordance with the prior art it is then possible to determine and establish which of the two revolution counters supplies the valid signal.

In the inventive revolution counter 11, the domain walls themselves move in an arrangement of a plurality of loops, described in greater detail below, which arrangement is produced for instance by a structuring process and in each of which loops a defined number of domain walls is inscribed by an initialization process, which is also described below. These different loops are configured such that for instance the first repetition of the arrangement of all of the domain walls present in the different loops does not occur until after, for example N=4096 or more so that the revolution counter always supplies unambiguous values up to the pre-specifiable maximum number of revolutions.

The present specific domain configurations can be determined using a number of electrical contacts on the loops based on magneto-resistive effects, e.g. the GMR (giant magneto-resistance) effect or the TMR (tunneling magneto-resistance) effect and this makes it possible to find the number of revolutions of a magnetic field that the domain walls move in the closed loops. This determination of the domain configuration uses the known effect that the resistance in a GMR or TMR stack is a function of the relative direction of magnetization of the layer in which the domains move compared to a reference direction defined by a hard magnetic layer.

The resistance is low when the direction of magnetization is the same in the reference layer and in the sensor layer and it increases (6-10)% (in the case of the GMR effect) or (100-500)% in the case of the TMR effect, when the direction of the two magnetizations is anti-parallel.

Figure 2:
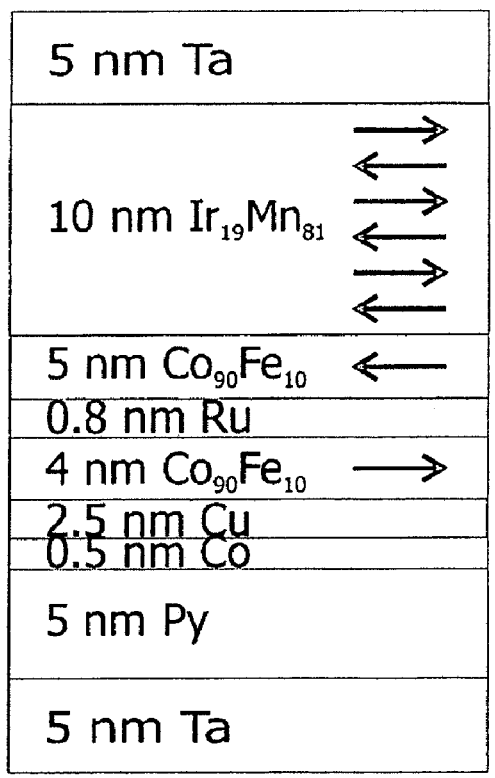
FIG. 2 depicts an exemplary stack of layers that can be employed for using the GMR or TMR effect.

FIG. 2 depicts an example of a stack of layers that is to be employed for exploiting the GMR or TMR effect. FIG. 2 depicts a cross-section of a packet of layers that is known per se. The current flows in the direction of the indicated magnetization arrows (in the layer plane), and the electrical resistance is determined using electrical contacts (not shown here) that are attached at a great distance from one another (100-500 µm). In the present invention, if a TMR stack is employed, the 2.5 nm-thick copper layer depicted in FIG. 2 is replaced with a 1-2 nm-thick $Al_2O_3$ or MgO layer. The current then flows vertically through the stack of layers from bottom to top or vice versa. In general, the TMR stack occupies a surface area of a few to a few multiples of 10 to 100 $\mu m^2$. It is not necessary to provide additional embodiments for special designs of GMR or TMR stacks of layers at this point because these belong to the known prior art. Therefore only the following explanation will be provided:

A $Ni_{81}Fe_{19}$ layer (permalloy=Py) acts as the actual sensor layer in which the magnetic domains move, the 0.5 nm-thick Co layer only increasing the GMR or TMR effect. A combination of a so-called artificial anti-ferromagnet (CoFe/0.8 nm Ru/CoFe) in combination with an anti-ferromagnet (in FIG. 2: IrMn, otherwise also NiMn or PtMn) acts as the hard magnetic layer. The 0.8 nm-thick Ru layer ensures that the magnetic moments of the two CoFe layers are anti-parallel and cancel one another out. The IrMn in combination with a CoFe layer produces a so-called unidirectional anistropy. This defines the magnetic preferred direction. It can be homogeneous in the entire wafer and thus also in the inventively formed loops; using suitable local heat treatment and simultaneously the effects of magnetic fields, the reference direction can also be defined in a non-uniform manner locally, for example, rotated 90° with respect to the previous preferred direction. This provides, for example, advantages with respect to establishing the reference direction in the sense of aforesaid valid ranges for the measurement signal.

For the certain movement of the domains in the sensor layer, a minimum field $H_{min}$ is necessary that is a function of the geometry (height and width of the sensor layer) and magnetization of the material of the magnetically soft layer that is structured in the inventive loop shape described below. At the same time, the proposed principle requires that the number of domains inside the loop does not change while the revolution counter is in use. This means that the magnetic field acting on the revolution counter must always be less than a magnetic field $H_{nuc}$ at which nucleation of a magnetic area occurs and thus two additional domain walls are generated, which is, however, easily satisfied by selecting the magnetic field of the rotating permanent magnet 20 (see FIGS. 1a and 1b) that is acting on the revolution counter.

The basic principle for counting the number of revolutions can be attained in different ways. In the proposed invention, proposed shapes are based either on loops having cusps that are oriented inward and have a structure that permits binary-type counting or on loops having inwardly-oriented cusps that are constructed such that they each attain a coprime number of revolutions in every loop. With these two variants it is possible with a relatively small number of loops to attain a large number of countable revolutions (in the described embodiment N>=4096) revolutions and convert them to user-friendly signals with relatively straightforward circuitry. There are typically <=12 loops for binary variants and <6 loops for coprime variants.

Figure 3:
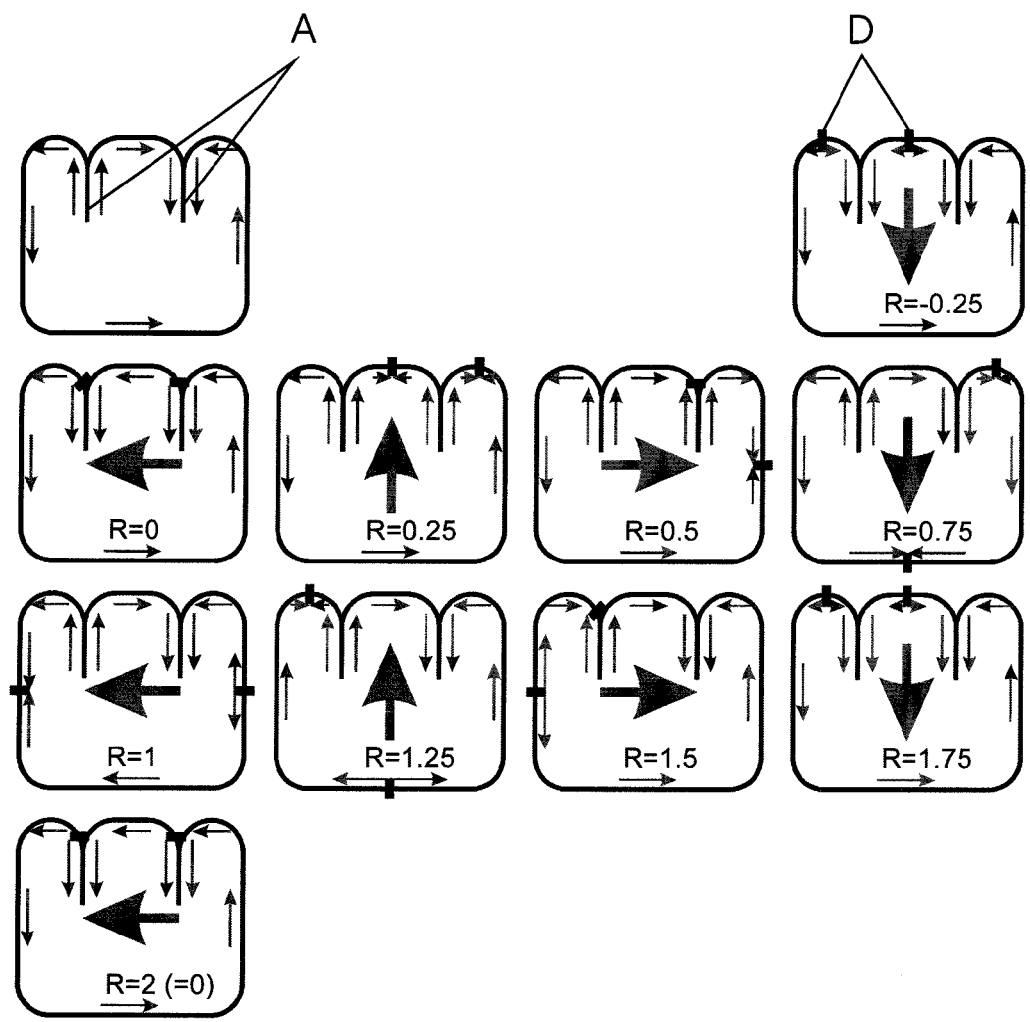
FIG. 3 depicts a first exemplary inventive loop having two inwardly oriented tapered protuberances.

To facilitate understanding, the basic principle of the present invention shall be explained for one of the inventive loops for counting two revolutions using FIG. 3. As will be explained in the following, this loop has two inwardly oriented tapered protuberances A. In the initial configuration (top left depiction in FIG. 3) the loop and its two cusps are initially produced without any domain walls. Then a configuration like that in the depiction in the top right of FIG. 3 is produced by means of a configuration line, not shown in this figure. This configuration corresponds to the ¼ revolution. The domain walls D that move through the loop from quarter revolution to quarter revolution and after exactly two revolutions are back in the initial configuration are depicted by small black rectangles in the individual depictions in FIG. 3. The central bold-face arrow indicates the direction of the permanent magnet to be detected (not shown here; see component 20 in FIGS. 1a and 1b) and thus of the rotating component. The thinner arrows in the depictions in FIG. 3 indicate the local direction of magnetization in the sensor loop layer.

Comparing the condition in FIG. 3 (R=number of revolutions) for R=−0.25 and R=0.25, that is for exactly half a revolution, it is evident that one domain wall requires one 180° revolution of the magnetic field for moving through the cusp. For the two cusps provided here, then, one revolution of the magnetic field is needed for moving across the two cusps. One additional revolution by the magnetic field, that is, in this case moving the domains along the depicted loop area without cusps, is required to go through the entire loop and return to the initial position.

Thus, it follows for the inventive structure of the provided loop n, which is dimensioned for counting n whole-number 360° revolutions, that this loop includes 2n−2 cusps that project into the interior of the loop (n should be >=2). Thus a 180° revolution can be detected by each of these cusps. Therefore, generalizing this case with 2n−2 cusps, exactly n−1 complete revolutions can be detected. The movement of the domains through the loop area without cusps results in another revolution, so that this arrangement is for exactly n complete revolutions. Therefore after n revolutions the configuration of the domains for R=0 and R=n is identical (where R is the number of revolutions of a permanent magnet in one direction [regardless of whether this is clockwise (cw) or counter-clockwise (ccw)]). Inventively combining a plurality of loops that all have this property (see in advance FIGS. 14 and 15) makes it possible to unambiguously determine a greater number of revolutions. Using the proposed arrangement it is even possible to attain revolution counts>4000 in miniaturized form but still with acceptable technical complexity.

Depending on the object, two basic variants of loop combinations are possible, specifically an arrangement with a binary construction or a coprime arrangement. How this should be construed shall be explained in the following. However, other designs, which may however be more complex, are also within the scope of the invention if they provide an unambiguous allocation of domains moved in loops having inwardly oriented tapered protuberances.

The initial configuration for the system constructed in a binary fashion proposed in accordance with the invention as the first option is characterized in that for n revolutions the loop includes exactly n magnetic domain walls that are all disposed adjacent to one another. In the framework of the invention, the cusps are to be embodied as sharp as possible so that the ratio of width to length for the cusps is at least 1:3 and the curvature radius for the cusps is itself as small as technologically feasible.

Figure 6:
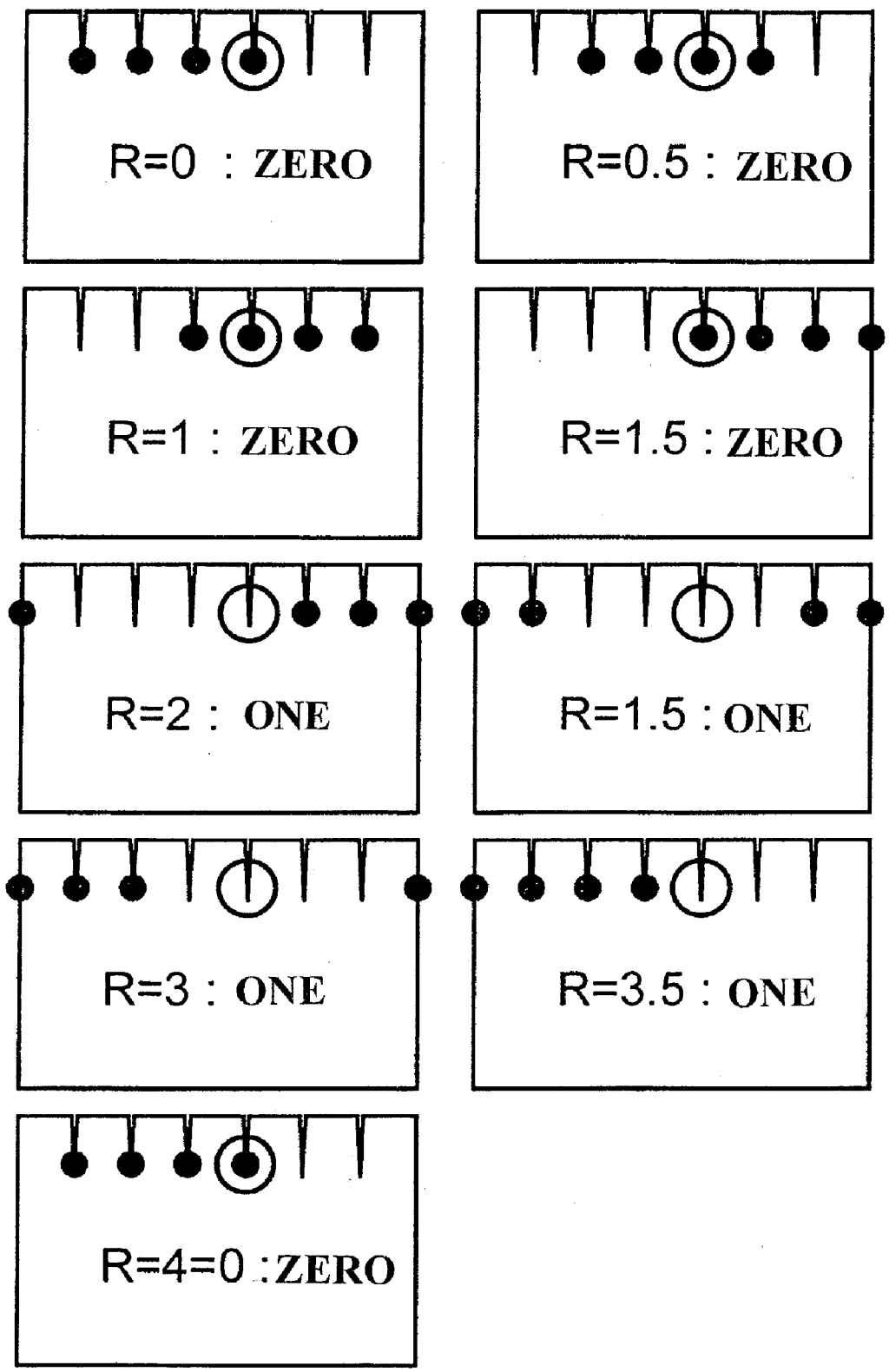
FIG. 6 is a schematic depiction of a loop arrangement for counting four revolutions having six cusp-like, inwardly oriented protuberances and four domains.

FIG. 6 provides a counting scheme for the binary counter variant having n=4. The loop depicted here should be able to detect four revolutions and thus, given the above condition, is provided with six cusps (2n−2), and four domains that are disposed adjacent to one another are inscribed. For the evaluation, the electrical resistances in the adjacent areas of the cusps marked with a circle are compared. The resistances to the right and to the left are equal or unequal depending on whether a domain is disposed in the cusp or not, and they can thus be assigned to the logical value, ZERO or ONE, that is entered in the loop.

Thus, in the framework of the invention it is possible to inscribe the required number of domains at a pre-specifiable location within the loop that is desired as the initial zero position for counting revolutions. At R=0, the magnetic domain walls are preferably disposed at the initial position indicated in FIG. 6 (top left) in order to begin counting at zero. If a non-volatile memory is provided in the evaluation unit advantageously present for reading out the various loops, any other initial condition may also be used that corresponds to the "zero position" and that is defined (referenced) as zero using the evaluation unit.

Figure 4:
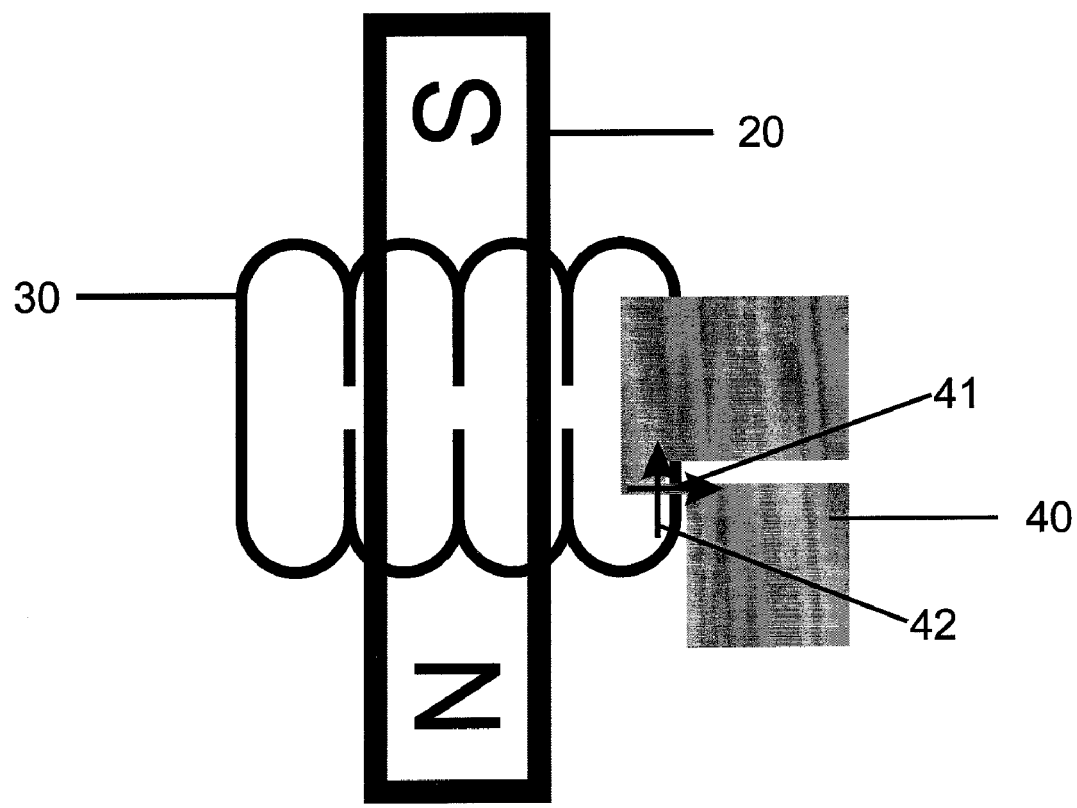
FIG. 4 depicts an example of a special layout for erasing domains that are present in an exemplary loop.

The initial configuration described in the foregoing may now be adjusted for the invention for instance as described in the following, for which purpose FIG. 4 provides a schematic depiction of one possible embodiment using a special loop:

FIG. 4 depicts a loop for n=4 (total revolution 4·360°) having a narrow electric conductor across the loop. In the plane of the loop, with a current flow in the narrow part of the conductor to the right, the narrow conductor produces a magnetic field upward (see arrow 42). First all of any domains present in the loops are erased, i.e. the loops are rendered domain-free. In addition, disposed on the loop 30, depicted individually in FIG. 4, is an additional conductor 40. It covers the loop 30 at a location and has only a slight width there. Thus the current density is high at the location 41 and therefore the magnetic field (see arrow 42) that acts beneath the conductor 40 at the site of the loop 30 on the location 41 is strong. The erasure process now occurs in that the rotating magnetic field, here produced by the permanent magnet 20, is rotated exactly n times over the loop for one full revolution. For this, a magnetic field H is needed in the limits $H_{min} < H < H_{nuc}$, as described in the foregoing. During the erasure process for the loop, the current produces a magnetic field $H > H_{nuc}$ beneath the conductor at the site of the loop of a magnitude such that the magnetization there is parallel to the magnetic field acting on the sensor layer, regardless of the previous orientation. In accordance with FIG. 4, the magnetic field having the strength H is rotated at least 4 times (for the loop n times for n revolutions) in one direction (cw or ccw). The revolution is stopped when the direction of the magnetic field from the permanent magnet 20 that is acting on the loop 30 coincides with the direction of the magnetic field 42 that is produced by the conductor 40 in the loop. The revolution of the magnetic field moves all of the domains present in the loop to the site of the large magnetic field. It is erased there.

The return of the conductor 40, which in one advantageous embodiment is returned to another location across the loop, also, should have a width such that the magnetic field that acts below in the plane of the loop does not impede the transport of the domains through the rotating permanent magnets. This can typically be attained in that the return is approximately 5 times as wide as the narrow part of the conductor 40 that produces the strong magnetic field. In accordance with one such approach, the first loop depicted in FIG. 3 (top left), for instance, has been shifted to a configuration that has no domain walls.

For other loop configurations, and other numbers of domains, the foregoing formatting process occurs analogously, without it being necessary to present it here in greater detail, because it is within the freedom of choice for the person of average skill in the art.

The desired starting configuration is distinguished by the direction of the magnetization in the left cusp (see loop, upper right of FIG. 3, to stay with the example).

Figure 5:
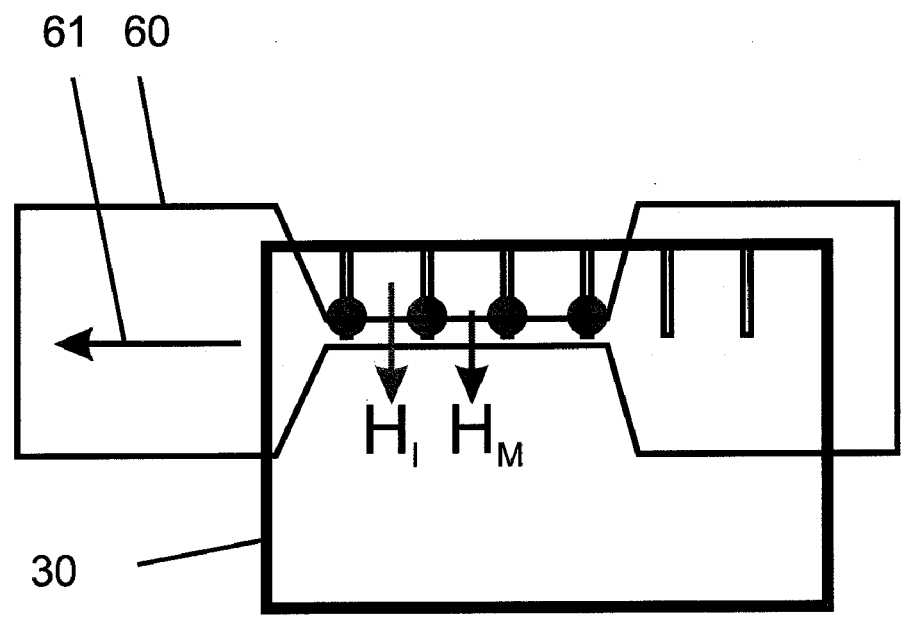
FIG. 5 depicts an example for a special layout for defined inscription of a pre-specified number of domains in an exemplary loop.

Now a desired domain configuration can be inscribed using another additional current conductor that in FIG. 5 has an exemplary geometry and that is shown separately in FIG. 5 for the sake of clarity. FIG. 5 depicts one of a number of potential and possible embodiments of the additional current conductor 60, which in the example is guided via the ends of four inwardly oriented cusps for the loop 30. The electrical current I flowing through the additional current conductor 60 (see arrow 61) produces the magnetic field $H_I$, and positioned parallel thereto is a DC field having the strength $H_M$, where $H_I$ and $H_M > H_{nuc}$.

The current flows through the additional current conductor 60, which in the example is embodied tapered in the area of the ends of adjacent cusps in the loop 30 and thus produces a high current density and therefore a strong magnetic field $H_I$. If a magnetic field $H_M$ having the strength $H_{Min} < H_M < H_{nuc}$ is parallel to the flowing current, the magnetizations in the cusps that are disposed under the narrow area of the additional current conductor 60 are remagnetized in the direction of the magnetic field $H_I$ and the resulting domains are transported out of the cusps through the magnetic field $H_M$. The resultant configuration is comparable to the condition R=−0.25 depicted in FIG. 3.

Other layouts for erasing and inscribing domains are possible and will follow from the specific conditions under which the inventive loops are produced. In addition, such circuits for erasing and inscribing do not limit the invention, since once the required number of domains per provided loop has been inscribed it can be removed again without having a negative impact on the functionality of the revolution counter, since when the revolution counter is used properly a number of domains inscribed per loop always remains in the loop.

There is greater freedom for selecting the initial configuration for the other aforementioned basic second embodiment, specifically for counting with loops that count a coprime number n. In this case, in a first possible embodiment it is only necessary for at least 2 domains to be in the loop, but no more than 2n−2 domains, and for the arrangement of the domains to agree with the initial configuration only after n entire revolutions. We turn now to the special description of a configuration having two adjacent domain walls as a starting configuration, as described below, but this shall not be construed as a limitation in general.

First the revolution counter constructed using the binary principle shall be described in more detail in the following.

According to the considerations described in the foregoing, in this case loops are to be constructed that indicate a periodic behavior for n=2, 4, 8, 16, 32, 64, 128, 256, 512, 1024, 2048, and 4096 in order to depict N=4096.

This can be accomplished as follows:

The width of an inventive loop perpendicular to the direction in which the domain runs should be constant at all locations and for instance should be between 100 and 200 nm. The loop itself is created e.g. using a stack of layers that has the giant magneto-resistance (GMR) effect. Such a stack of layers may have, for example, a typical structure of the type that follows:

3 nm Ta/5 nm $Ni_{81}Fe_{19}$ like others/1 nm $Co_{90}Fe_{10}$/2 nm Cu/3 nm $Co_{90}Fe_{10}$/0.8 nm Ru/3 nm $Co_{90}Fe_{10}$/10 nm IrMn/5 nm Ta.

The 5 nm $Ni_{81}Fe_{19}$ like others/1 nm $Co_{90}Fe_{10}$ sandwich acts as a soft magnetic layer through which the domain walls run. For the instant application, in contrast to known GMR layer systems for angular sensors, it is practical to make the NiFe layer significantly thicker (typically 15-20 nm) in order to ensure that the so-called shape anisotropy is high, the shape anisotropy essentially being determined by the thickness/width ratio and by the magnetization of the sandwich layer. Naturally, instead of using a Py layer, it is within the framework of the invention to use a layer made of a different soft magnetic alloy, for instance a CoFeNi, with a layer thickness between 5 . . . 35 nm.

A high anisotropy compels that the magnetization in the NiFe layer, with the exception of the domains themselves, can always be only parallel to the edge. Thus there are only two stable conditions for the directions of the magnetization of the sensor layer that are oriented anti-parallel to one another. A high shape anisotropy is furthermore responsible for the fact that the magnetization does not switch spontaneously until there are relatively strong magnetic fields of typically 20-80 mT.

According to the adjustment in the initial configuration, as described using FIGS. 4 and 5, in the example in accordance with FIG. 6 four domains are disposed in the loop n=4 exactly at the locations marked in FIG. 6 (top left). The conditions after ½, 1, 1.5, 2, 4 revolutions, depicted in FIG. 6, result if a rotating magnetic field (not shown) acts on the entire loop. It is clearly evident that in this configuration the initial condition is re-attained after exactly four revolutions. The same can be attained for any desired loop that is to count n revolutions. There must be exactly 2n−2 cusps that are oriented inward for this loop. In the initial configuration, exactly n domains are inscribed using the attached additional current conductor 60 (see FIG. 5). For binary counting, this means loops with n=2, 4, 8, 16, 32, 64, 128, 256, . . . , the length of the tapered inscribing conductor 60 being adjusted for each and increasing as n rises.

Figure 8:
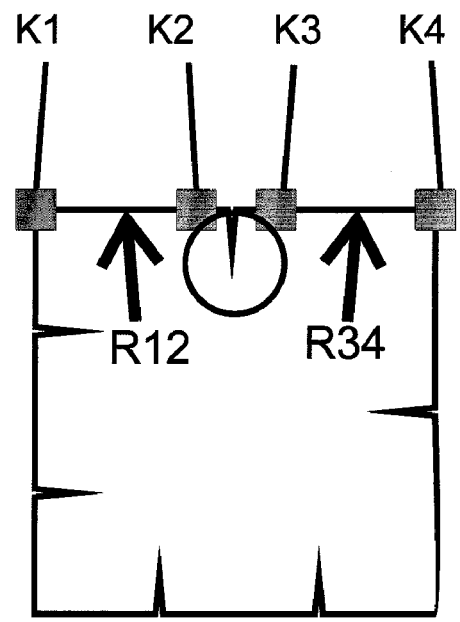
FIGS. 8 and 9 depict examples of contact arrangements in a loop configuration constructed according to the binary principle.
Figure 9:
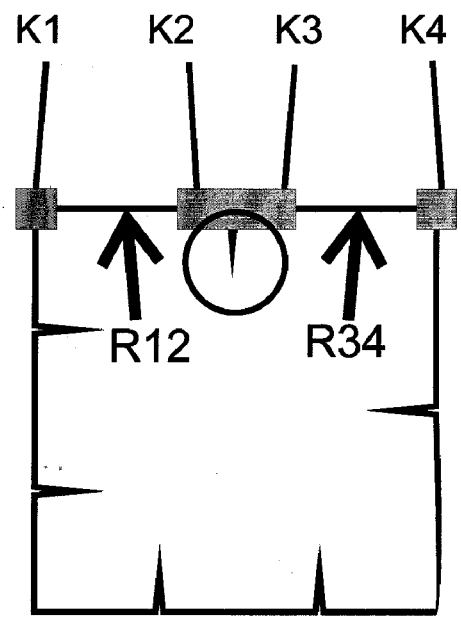

For reading out the loops, first the binary case and the situation for n=4 should be considered:

Without excluding other possibilities for the configuration, it is possible to provide e.g. a contact structure suggested in FIG. 8. FIG. 8 provides an example of the arrangement of contacts K1 through K4 to the right and left adjacent to an inwardly oriented cusp. Such a contact structure permits the determination of the resistances R12, R34 of the loop segments, which for the sake of simplicity are depicted in FIG. 8 without the required roundings, to the right and left of the first cusp. If there is a domain wall in the area of the cusp identified with a circle, then the two areas disposed to the right and the left adjacent to the cusp are either both high impedance or are both low impedance. The logical ZERO is assigned to this condition. If there is no domain wall in the area of the cusp, then one of the two areas is low impedance and the other is high impedance. The logical ONE is assigned to this condition. As is evident when compared with FIG. 6, for R=0, 0.5, 1, and 1.5 the result for this loop where n=4 is $r_4$=ZERO. The result for R=2, 2.5, 3, and 3.5 is $r_4$=ONE. R=4 is a repeat of R=0, i.e. the result after n revolutions in the loop in question is ZERO for the first n/2 revolutions and ONE for the subsequent n/2 revolutions. Then the entire process repeats periodically.

The number of calculated revolutions in an arrangement of loops where n=2, 4, 8, . . . N then results from the equation:

$$R = r_2 \cdot 2^1 + r_4 \cdot 2^2 + r_8 \cdot 2^3 + r_{16} \cdot 2^4 + r_{32} \cdot 2^5 + r_{64} \cdot 2^6 + \ldots + r_s \cdot 2^S$$

or expressed generally:

$$R = \sum_{i=1}^{S} r_{2^i} \cdot 2^i$$

S is selected such that the number of revolutions to be counted is $N=2^S$.

Figure 7:
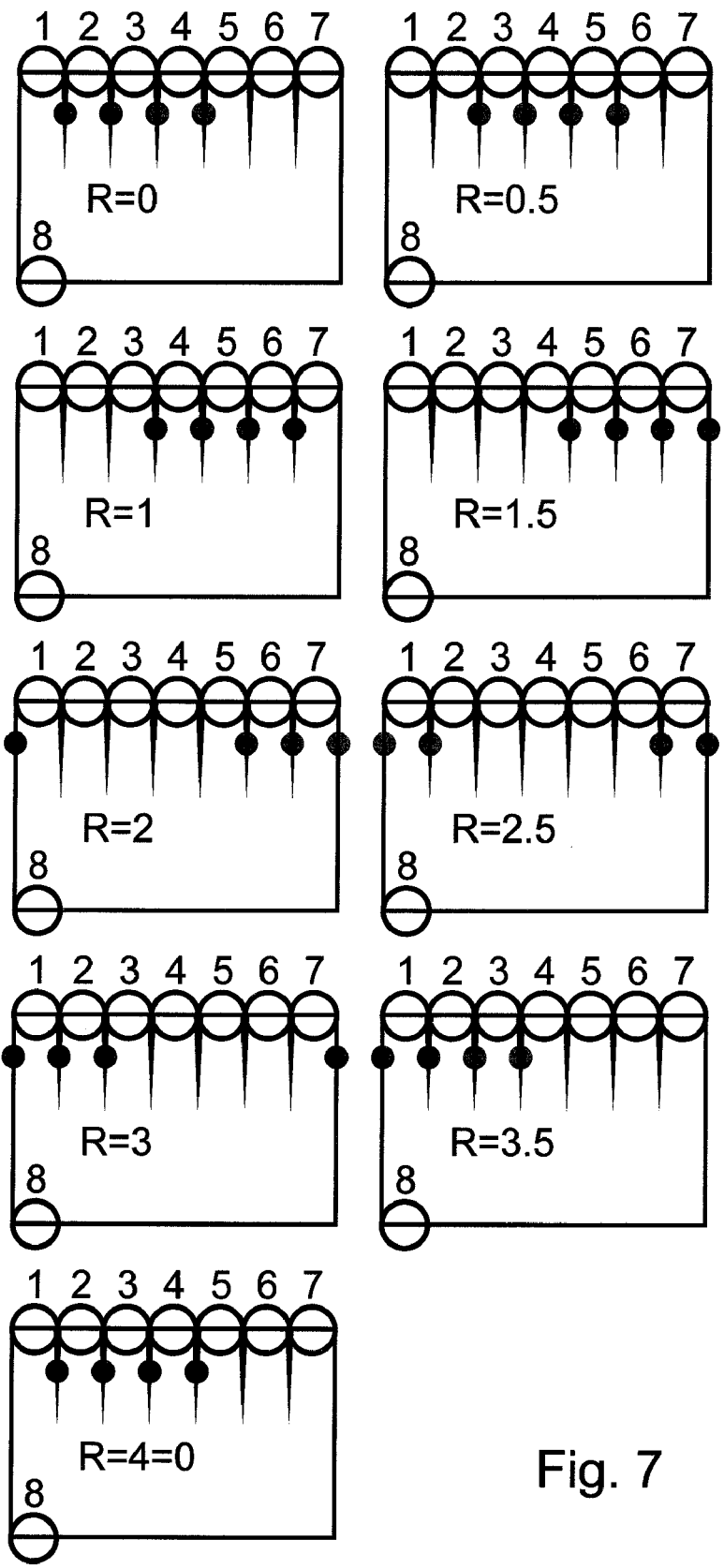
FIG. 7 depicts examples of contact arrangements for a coprime loop configuration.

The other inventive embodiment, specially mentioned in the foregoing, draws on the coprime nature of the loops used. Thus, if loops are constructed that e.g. re-attain their initial configuration after exactly 3, 4, 5, 7, and 11 revolutions, the entire arrangement does not re-attain its initial configuration e.g. until after 3*4*5*7*11=4620 revolutions. Thus even a large number N of revolutions can be counted in loops having a coprime number of different revolutions to be counted. The advantage of such an arrangement is that in it the number of the cusps projecting into the interior of the loops can be kept much smaller than in the aforesaid binary configuration, so that the geometric extension of the loops can be scaled down even further. However, this advantage is offset in that the loops are read out in a different manner. While in the binary counting loops it is only necessary to determine the loop conditions "ZERO" or "ONE", the exact domain condition for each loop must be determined in the configuration with "coprime" loops. This means e.g. for the loop in which n=4 that it must be calculated whether the loop has experienced 0, 0.5, 1, 1.5, 2, 2.5, 3, 3.5, or 4=0 revolutions. This can be accomplished in that at least 2n contacts must be given to the loop n, it being possible to resolve the problem described in the foregoing with these contacts, as is depicted in the example in FIG. 7. FIG. 7 illustrates a counting scheme for the variant of the coprime loop embodiment and n=4 as the whole number representing the 360° revolutions that can be counted using this loop.

In this special example, an initial configuration has been selected in which four domains were inscribed at the beginning, depicted by the solid circles in FIG. 7. As the table below indicates, all eight possible values are logically different and can therefore be assigned via an appropriate circuit to the conditions 0, 0.5, . . . 3.5.

If a domain wall is between the contacts (here numbered 1 . . . 8), the resistance value between the first six aforesaid pairs (1-2 through 6-7) is equal and is different for pairs 7-8 and 8-1, because there has been a 180° loop revolution between these last two said pairs. If there is no domain wall between them, the resistance for 1-2 through 6-7 is not equal and is equal for 7-8 and 8-1.

The following truth table results:

| R | 0 | 0.5 | 1 | 1.5 | 2 | 2.5 | 3 | 3.5 | 4 = 0 |
|---|---|---|---|---|---|---|---|---|---|
| 1-2 | Zero | One | One | One | One | One | Zero | Zero | Zero |
| 2-3 | Zero | Zero | One | One | One | One | One | Zero | Zero |
| 3-4 | Zero | Zero | Zero | One | One | One | One | One | Zero |
| 4-5 | Zero | Zero | Zero | Zero | One | One | One | One | Zero |
| 5-6 | One | Zero | Zero | Zero | Zero | One | One | One | One |
| 6-7 | One | One | Zero | Zero | Zero | Zero | One | One | One |
| 7-8 | One | One | One | Zero | Zero | Zero | Zero | One | One |
| 8-1 | One | One | One | One | Zero | Zero | Zero | Zero | One |

Configuring the initial situation differently is also within the framework of the invention, and would result in a different truth table. The only requirement for the initial configuration in this case of counting n whole 360° revolutions and the coprime arrangement is that the loop n contains less than 2n but at least two domains and the domains are arranged such that a configuration or a position of the domains does not recur until after n revolutions. Each of these configurations permits the bijective calculation of the number of revolutions R between 0 and n. Each initial configuration is precisely linked to exactly one truth table that can be determined prior to the beginning of the counting process using the geometry of the aforesaid additional elements (erasing and inscribing component).

From the information presented in the foregoing, it is evident that a revolution counter with the binary variant construction requires a plurality of the inventively provided loops and cusps, but fewer electrical contacts for reading out and assigning logical conditions than in a loop arrangement that uses the coprime principle in which the situation is exactly the opposite—in other words fewer loops and cusps, but more contacts.

Because the placement of the contacts that are to be attached for reading out the resistance values is completely different depending on which structure described in the foregoing is selected for the loops (binary, coprime) and because there are additional problems associated with unambiguous signal assignment in this regard, some basic suggestions shall be considered in the following. FIGS. 8 through 11, which provide examples of possible configurations for providing electrical contacts, shall be used to better illustrate these situations and additional variants.

FIG. 8 is an example of a loop in which n=4 and there is binary evaluation. In this case the electrical resistances R12 and R34 are measured at the contacts K1 through K4. As FIG. 9 indicates, combining contacts K2 and K3 simplifies the circuit. The resistance values are assigned to the logical conditions in a logic circuit that is outside the invention and can be created in the manner desired, as stated in the foregoing.

As discussed in the foregoing, the movement of the domains is associated with a hysteresis, and the result of this is that in general one sensor alone is not always able to supply the correct information about the number of revolutions. For the example of the hollow shaft sensor, this problem can be resolved in a simple manner using a second sensor, as depicted in FIG. 1a. There are a number of options for resolving the hysteresis issue for the central arrangement in accordance with FIG. 1b. The most simple solution, but also the most expensive solution, is to use a second sensor that is rotated 90°. The signal from an additionally present angular sensor then decides from which revolution counter the valid signal can be obtained. In the case of binary counting this can be omitted if a solution like the example in FIG. 10 is used.

Figure 10:
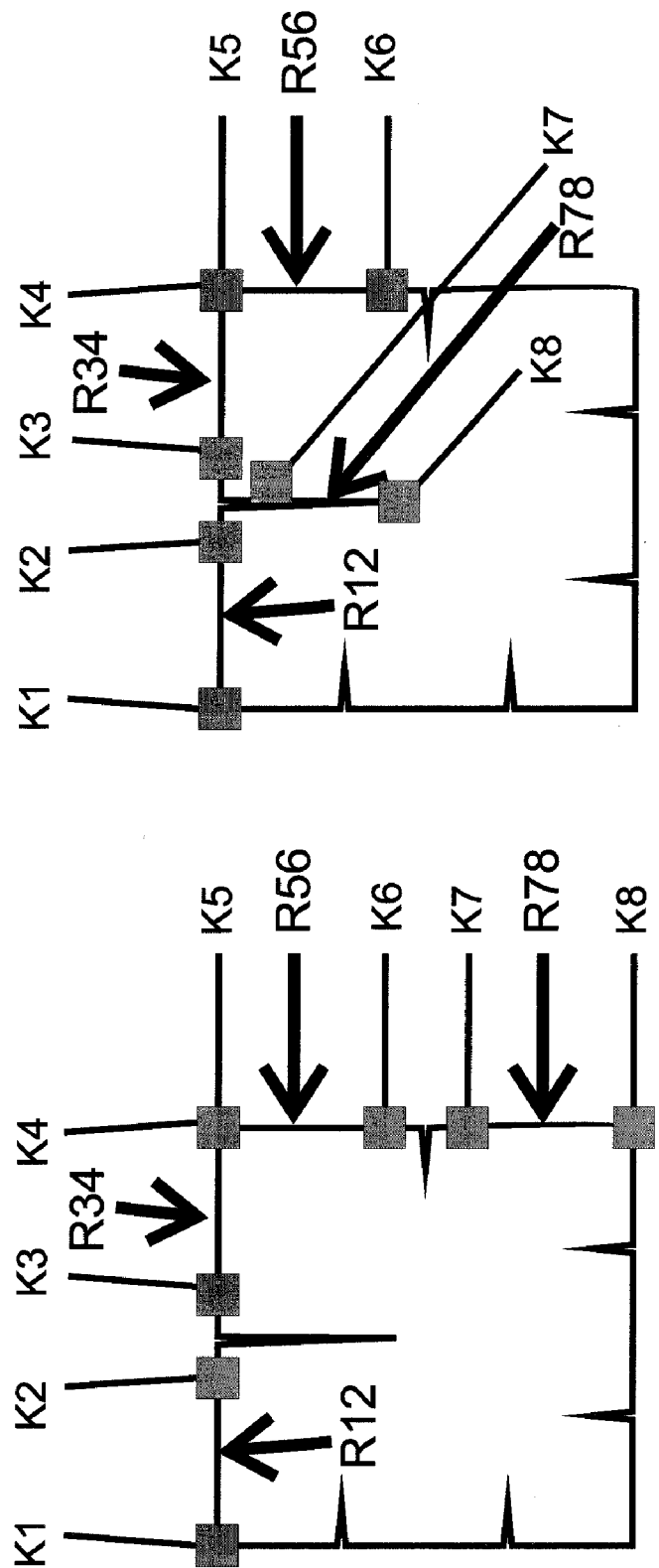
FIG. 10 depicts examples of contact arrangements for eliminating the hysteresis problem.

The left-hand side of FIG. 10 depicts an arrangement of contacts K1 ... K8, four contacts (K1 ... K4) being arranged on a horizontal part of the second conductor and four contacts (K55 ... K8) being arranged on a vertical part of the conductor. The right-hand part of FIG. 10 depicts an example of an alternative arrangement for the contacts. In this case, the contacts for the binary evaluation are at K1 through K4 for the 0° sensor, the sensor rotated 90° is integrated in the loop and is represented by the contacts K5 through K8. However, in such a solution it must be noted that, if a GMR stack of layers is used, the reference layer must not be vertical on the series of conductors in which the resistance is measured. For the loop depicted in FIG. 10 this could mean that the reference direction is at an angle, preferably a 45° angle, to the straight lines in which the resistance is determined. Another possibility is for the reference to have a uniform direction in a first step, in this case without any general limitations, e.g. parallel to the bar R12, and in a subsequent step for the loop to be heated, e.g. via the contacts K5 through K8, until the reference direction experiences a local revolution, typically 1T, under the effect of the local temperature when a magnetic field of sufficient magnitude is applied.

When using loops with a coprime number for the revolutions to be measured, the principle for arranging the contacts in FIG. 10 can be used analogously with the difference that in this case contacting must occur at all cusps.

FIG. 11a initially illustrates basic attachment of contacts using a GMR stack of layers, from which the entire inventive loop arrangement is then to be produced based on the foregoing, and FIG. 11b illustrates the use of the TMR stack of layers, which is also possible. Further below there is more detail about the latter regarding dimensioning. As is illustrated in FIG. 11a, the electrical contacts for determining the resistance and thus the direction of magnetization are to the left (K1 and K2) and right (K3 and K4) of a cusp and the direction of the reference magnetization goes from left to right or vice versa. If the domain (or domains) in the entire loop are to be localized, contacts must be attached in all horizontal areas, as is depicted in FIG. 11c1. Each pair of contacts then detects the changes in resistance from one contact area to the other that are caused by domain migration due to a 180° revolution of the magnetic field. The distances between the contacts (e.g. K1 and K2) should ideally be the same in the case of GMR layer systems. Contacts may be combined, as illustrated in FIG. 11c3, in order to keep the number of contacts that are to be electrically connected as low as possible.

If the cusps do not all go from one side of the loop into the interior, the contact arrangements should be attached as depicted e.g. in FIG. 11c2 such that domain migrations can even be detected when the outer magnetic field rotates 180°. This means that on all horizontal areas of the loops contacts are attached to the right and left of the cusps that point up or down. If one or a plurality of cusps points into the interior of the loop from the right-hand and/or left-hand side, one side of the cusp must be provided with the contacts. It is also possible in this case to combine contacts and thus reduce the number of contacts, as depicted in FIG. 11c4.

If there is a desire to eliminate the effects that are linked to hysteresis, contacts K5 through K8 must be attached in addition to contacts K1 through K4, as depicted in FIG. 11a. The reference direction (see bolded arrow in FIG. 11d1) must then ideally be rotated 45° or must be fixed locally using suitable measures (see aforesaid local thermal influence) such that it runs parallel to the areas to be measured. The contact arrangements that result from this are depicted as examples in FIGS. 11d1 through 11d4 for the variants: all cusps go out from one side/from different sides of the loop and contacts for these variants may be combined. The illustrated variants are only used as examples and do not limit the invention with respect to the type of contact connections. Regardless of the specific position, it is common to all of these depicted solutions that without combining contacts 4n contacts are needed for one loop for n revolutions. If the effects of hysteresis are also to be suppressed, 8n contacts are needed. Possible combining of contacts reduces their total number, as indicated in the examples in the figures described here.

In addition to the variants described in the foregoing, specifically the structure of the loops as a GMR stack of layers as indicated in the aforesaid, it is also possible in the framework of the invention to form the loop using only one ferro-magnetic layer that bears the domain walls. The magnetic condition of the ferro-magnetic layer, specifically the direction of the magnetization in the one direction or in the opposing direction, but always parallel to the conductor direction, can then be read by a locally attached TMR stack (FIG. 11b), which also defines the reference direction. The one contact for the TMR element is then attached directly to the TMR stack (upper electrode). The second contact, as the lower electrode, can be formed by the ferro-magnetic layer and therefore its contacting (not shown) can be at any desired location on the conductor. The same suggested layout as already described for the GMR stack of layers applies for the ferro-magnetic layer for the loop-like embodiment with inwardly projecting cusps and corners that are always rounded (this also being intended to include the loop areas outside of the cusps when there is a change in direction in the loop configuration), the radius of curvature of which is supposed to be greater than three times the loop width. Due to technical drafting constraints, the aforesaid roundings are only indicated in FIGS. 3, 4, 7, 13, 14, and 15.

If the TMR effect is used for reading the magnetization condition of the conductors, then, with no general limitation, the contact K1 should be used as the upper electrode for R12, contact K4 for R34, contact K5 for R56, and contact K8 for R78 (see FIG. 10). A common contact can be used for the lower electrode for all TMR elements. In contrast to the contacts K1, K4, K5, and K8, in which a TMR stack is disposed between the magnetic layer that carries the domain wall movement, e.g. an approx. 10 nm-thick $Ni_{81}Fe_{19}$ layer, and the contact, the common contact can be disposed directly on the NiFe layer. However, there may also be a TMR stack between this contact and the NiFe layer. In this case, however, the contact surface for this contact should be significantly larger with respect to the NiFe layer. In contrast, ideally contact surfaces with nearly identical sizes should be used for contacts K1, K3, K5, and K7 (FIG. 11b), since the resistance in these TMR elements is indirectly proportional to the surface area.

When using the TMR effect, it should be noted that it is the surface area that the contact has with the sensor layer that is critical for the magnitude of the resistance, not the distance between the contacts, that is, the distance between contacts K1 and K2 is not critical for R12. The size of the contact should be uniform throughout for the simplest possible evaluation.

Figure 12:
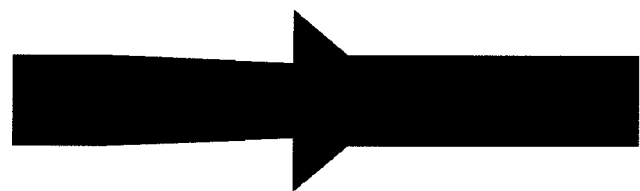
FIGS. 12 and 13 depict special embodiments within the loop structure for domain transport in only one loop direction.
Figure 13:
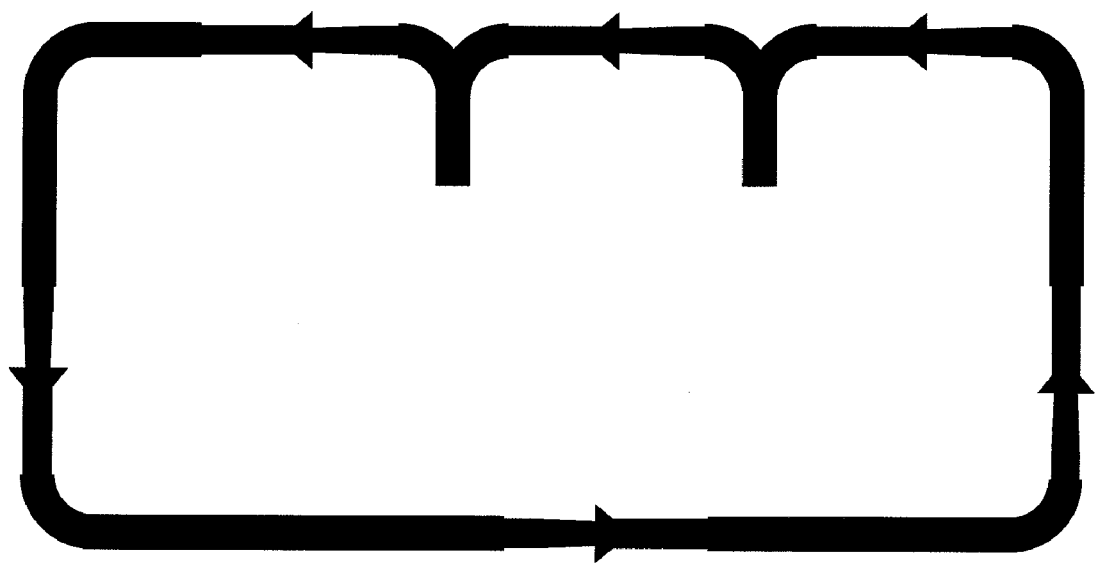

For special applications of the inventive revolution counter, such as e.g. in a gas or water pipe, there is a requirement that the counter must only count up. This can be attained when the normally constant width of loops described in the aforesaid have a structure as depicted in the segment in FIG. 12. FIG. 12 is a schematic depiction of a local change in width that leads to the domains being able to move through this geometrical construct only in one direction. Such a geometry means that in a field range $H_{min}<H<H_{Diode}$ the domains can be moved only in one direction. These types of geometrical structures are to be provided for such an application in all of the straight-line areas, as depicted in FIG. 13. FIG. 13 also illustrates an example of an arrangement of the constructs with a "diode" function in a loop where n=2.

For better understanding of how the aforesaid loop arrangements can be configured for revolution counters, FIGS. 14a and 14b, 15a and 15b depict top-views of the examples of different layouts for the inventive loop arrangements, but this shall not limit the invention.

Figure 14A:
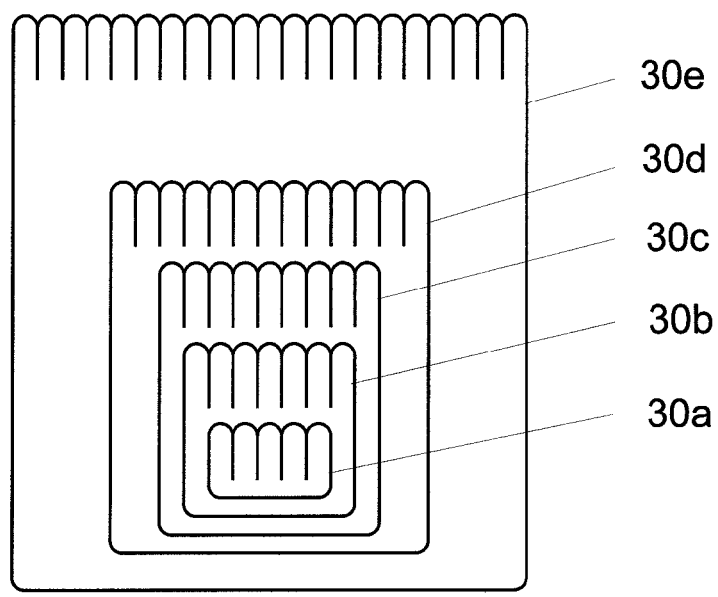
FIGS. 14a and 14b are examples of arrangement variants for a plurality of loops that are embodied according to the coprime principle.
Figure 14B:
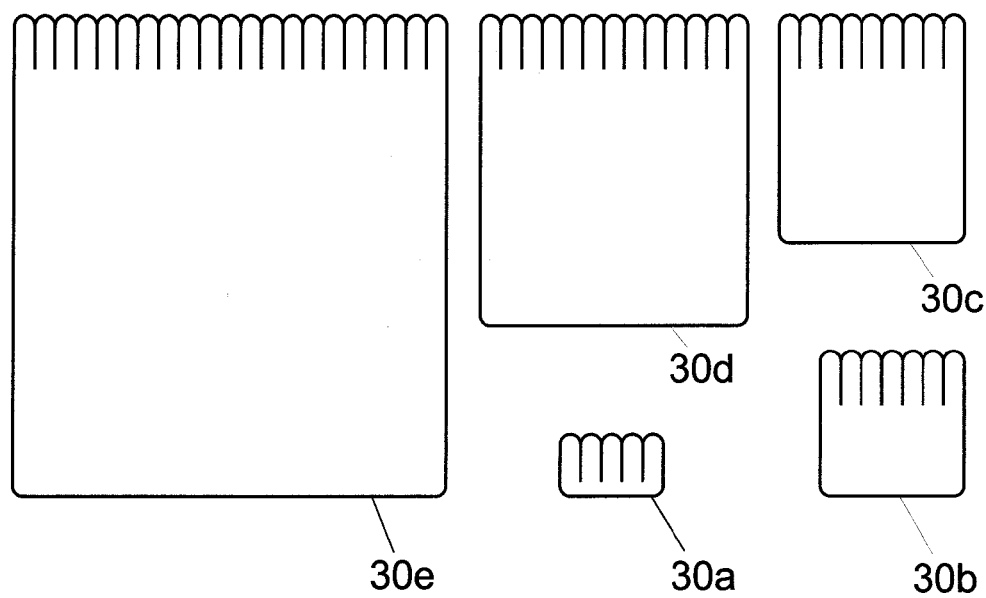

The drawings in FIG. 14 depict two possible examples of arrangements of loops for a revolution counter that is constructed and working using the principle of coprime loops for N=4620 with five individual loops 30a through 30e for n=3, 4, 5, 7, and 11, having 4, 6, 8, 12, or 20 inwardly oriented cusps, depending on the loop. As discussed in the foregoing, it is not important whether the individual loops are nested in one another (FIG. 14a) or are adjacent to one another, or whether some are adjacent to one another, on the substrate (10, see FIG. 1a or 1b), as long as all of the loop areas can be covered by the field of the rotating outer magnet 20 (see also FIGS. 1a and 1b).

Figure 15A:
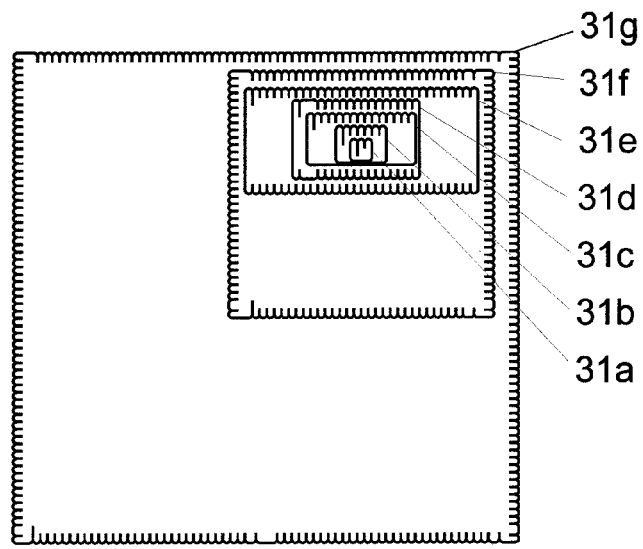
FIGS. 15a and 15b are examples of arrangement variants for a plurality of loops that are embodied according to the binary principle.
Figure 15B:
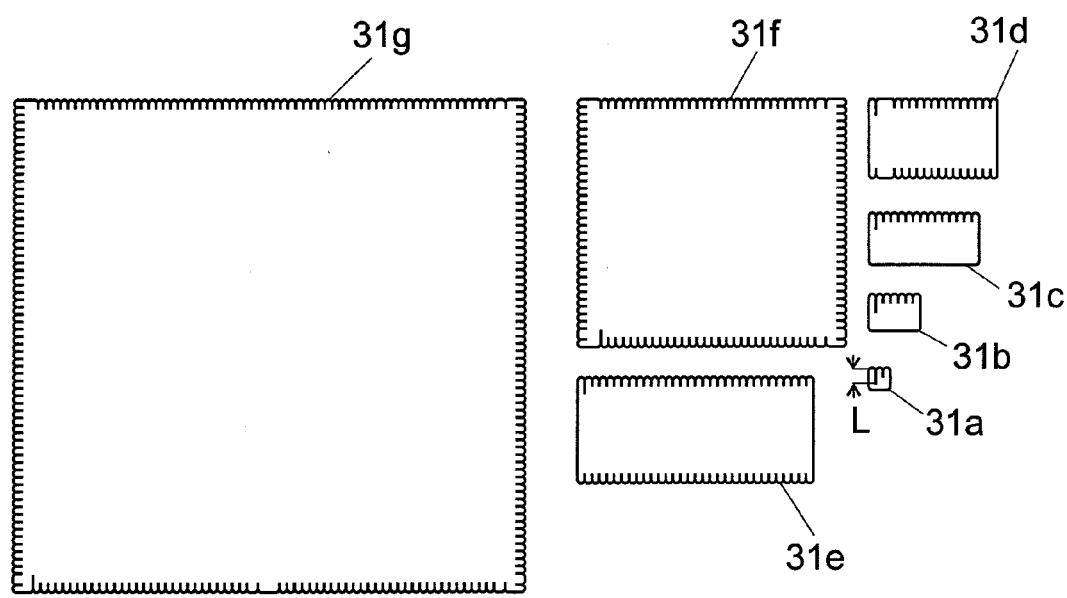

FIGS. 15a and 15b illustrate two possible examples of arrangements of loops for a revolution counter constructed and working using the binary principle for N=128, having 7 individual loops 31a through 31g for n=2, 4, 8, 16, 32, 64, and 128, with respect to 2, 6, 14, 30, 62, 126, or 254 inwardly oriented cusps, depending on the loop. As discussed in the foregoing, in this example reducing the complexity for attaching the necessary contacts, which are to be provided here on one cusp-like protuberance depicted with the length L in the drawings in FIG. 14, is offset by the increased number of loops compared to the coprime variant in accordance with the drawings in FIG. 14.

Figure 16:
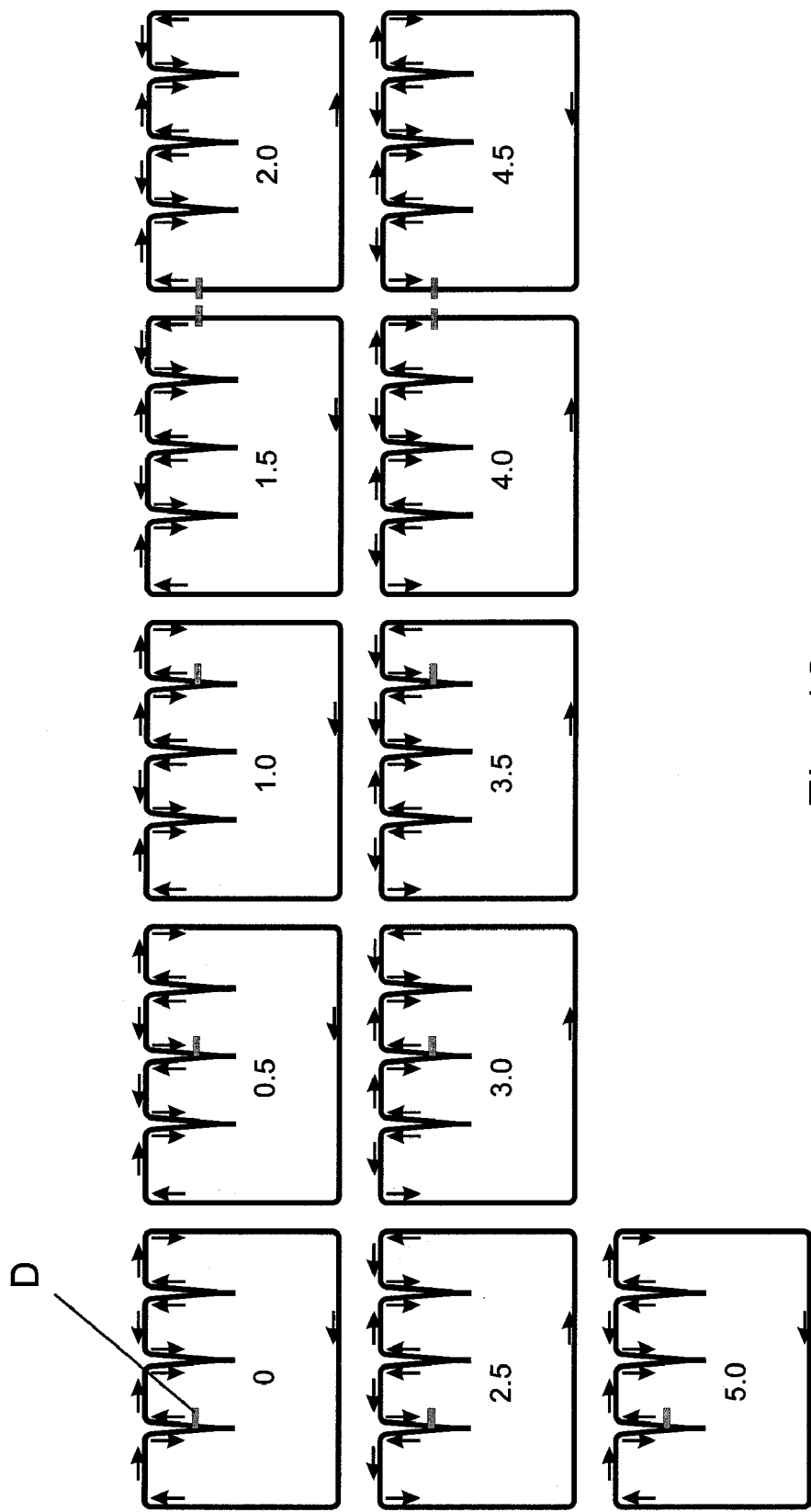
FIG. 16 is an exemplary loop configuration having an uneven number of tapered protuberances oriented into the loop interior.

But the coprime variant offers another additional advantage that shall be explained in the following. A first possible embodiment of this variant that detects only the site of the inscribed domains. However, in another design of the invention, the principle of measuring the resistances at each cusp also permits the following embodiment for the loops. A description follows:

Each domain requires one 180° revolution of the magnet to pass through a cusp. When there is an uneven number of cusps, for instance three cusps as depicted in FIG. 16, for reasons of symmetry the number of domains disposed in the loop is also uneven. In addition, after a half-integer number (number of cusps divided by two plus one), each domain is back in its initial position, that is, at a count of n 360° revolutions in half-steps, thus after 2.5 revolutions in the example. If the magnetization configuration is compared, in FIG. 16 for e.g. 0 and 2.5, after 2.5 revolutions the domain D depicted here is back in its initial position. However, all of the magnetization directions at 2.5 revolutions are oriented opposing those from 0 revolutions. This results from the fact that the number of direction changes is uneven due to the uneven number of domains. Thus, there is no problem distinguishing between the configuration for 0 and for 2.5, as here due to the use of GMR or TMR layer stacks, which are also sensitive to the direction of magnetization of the domains. As is evident from FIG. 16, it is only at five revolutions that both the position of the domains and also all directions of magnetization match. Therefore given an uneven number of cusps and the requirement for a coprime configuration it is possible to use fewer cusps per loop, which further simplifies layout, even for the coprime variant. This means that compared to an even number of cusps this type of solution has the advantage of reducing contacts and loop surface area and even loop length. Thus in a combination of just five loops, e.g. 2.5 revolutions (R), 3.5 R, 4.5 R, 5.5 R, and 6.5 R, 45045 revolutions are registered (5*7*9*11*13). When the number of cusps is uneven, there is the requirement that such a loop includes at least one domain and at most as many domains as cusps provided in the loop.

As long as the coprime relationship is maintained between the loops in the entire arrangement for counting 360° revolutions, it is entirely possible to provide a combination of loops that have an even and uneven number of cusps, which therefore is expressly under the present invention.

As is evident from the specific exemplary embodiments and variants that have been described, the choice depends on the specific object for the revolutions that are actually to be counted, given the advantages of the binary and coprime variants.

It is within the framework of the invention to arrange the revolution counters identified and described in the foregoing together or alone on a substrate with an evaluation unit or to connect them thereto, and also to provide the aforesaid angular sensor there, for instance embodied as an AMR (anistropic magneto-resistance). The evaluation unit may advantageously be formed by a CMOS circuit that may already include a Hall angular sensor.

Since all of the types of the arrangements that have been described as examples can be attached for instance to a CMOS chip with no problem in accordance with the arrangement examples described in FIGS. 14 and 15, the small size with which it is possible to produce a revolution counter in accordance with the present invention is evident compared to comparable revolution counters according to the prior art.

Another significant advantage of the present invention is comprised in that domain conditions that change when an outer magnetic field that when rotating changes their position, can even be detected subsequently if the voltage is interrupted and thus a revolution that occurs with no current, for instance revolution of a steering wheel, can be bijectively displayed.

All of the features that can be found in the specification, exemplary embodiments, and drawings can be essential to the invention individually as well as in any combination with one another.

The invention claimed is:

1. A magnetic revolution counter for unambiguous determination of a pre-specifiable number of revolutions to be determined for a rotating element, comprising:
   a plurality of sensor elements provided in a number depending on a number of revolutions to be measured for the element to be detected the sensor elements being formed by closed loops that are covered by magnetic domains and that guide them, said loops including at least one ferromagnetic and one soft magnetic layer, said loops including tapered protuberances oriented into the interior of the loop, a number of protuberances provided per loop being defined and varying from one of said loops to another of said loops;
   a magnet system, a magnetic field of which permits the detection of all said sensor elements, and
   electrical contact arrangements that permit changes in electrical resistance of pre-specifiable loop segments to be determined as resistance values after magnetic domains have changed location due to the effect of the outer rotating magnetic field of the magnet system in the pre-specified loop segments, said resistance values being suppliable to an evaluation unit for the purpose of correlating the number of revolutions of the rotating element.

2. A magnetic revolution counter according to claim 1, wherein, as the number of revolutions to be determined increases pre-specifiably, the number of provided sensor elements also increases.

3. A magnetic revolution counter according to claim 1, wherein the sensor elements are arranged geometrically nested inside one another on a substrate.

4. A magnetic revolution counter according to claim 1, wherein at least some of the sensor elements are arranged adjacent to one another on a substrate.

5. A magnetic revolution counter according to claim 3, wherein the substrate is formed by a semiconductor substrate having an integrated evaluation unit, the contact arrangements that are provided on the sensor elements being electrically connected directly to the substrate.

6. A magnetic revolution counter according to claim 4, wherein the substrate is formed by a semiconductor substrate having an integrated evaluation unit, the contact arrangements that are provided on the sensor elements being electrically connected directly to the substrate.

7. A magnetic revolution counter according to claim 2, wherein the contact arrangements that are provided on the sensor elements are electrically connected to the evaluation unit using flip chip engineering.

8. A magnetic revolution counter according to claim 2, wherein a fixed pre-specifiable and constant number of domains is inscribed in each of the sensor elements.

9. A magnetic revolution counter according to claim 2, wherein exactly 2n−2 number of said tapered protuberances that are oriented into the interior of the loop are allocated to a one of the loops that is provided for counting n whole-number 360° revolutions.

10. A magnetic revolution counter according to claim 2, wherein the number of tapered protuberances assigned to each of said sensor loops is established such that binary counting of the revolutions from loop to loop is made possible.

11. A magnetic revolution counter according to claim 8, wherein a loop for counting n revolutions having exactly 2n−2 number of said tapered protuberances is covered with exactly n magnetic domains disposed adjacent to one another.

12. A magnetic revolution counter according to claim 2, wherein the number of tapered protuberances assigned to each sensor loop is established such that coprime counting of the revolutions from loop to loop is made possible.

13. A magnetic revolution counter according to claim 12, wherein:
during coprime determination of the n whole-number 360° revolutions to be counted by a plurality of loops, each of said loops is covered by at least 2 domains, but at most 2n−2 domains; and
the arrangement of the domains within the loops does not match the initial configuration of domain arrangement until after n entire revolutions in the same direction.

14. A magnetic revolution counter according to claim 1, wherein an uneven number of tapered protuberances oriented into the loop is given to a one of the loops that is provided for counting n 360° revolutions in half-steps.

15. A magnetic revolution counter according to claim 8, wherein:
during coprime determination of n whole-number 360° revolutions in half-steps to be counted by the plurality of loops, each of said loops is covered by at least one domain, but at most as many domains as inwardly oriented, tapered protuberances that a particular one of the loops contains; and
the arrangement of the domains within the loops matches the initial configuration of the domain arrangement after n/2 revolutions in the same direction, but the magnetic orientation of the domains can be differentiated from the identical initial configuration after another n/2 entire revolutions due to the changed direction of magnetization.

16. A magnetic revolution counter according to claim 14, wherein:
during coprime determination of n whole-number 360° revolutions in half-steps to be counted by the plurality of loops, each of said loops is covered by at least one domain, but at most as many domains as inwardly oriented, tapered protuberances that a particular one of the loops contains; and
the arrangement of the domains within the loops matches the initial configuration of the domain arrangement after n/2 revolutions in the same direction, but the magnetic orientation of the domains can be differentiated from the identical initial configuration after another n/2 entire revolutions due to the changed direction of magnetization.

17. A magnetic revolution counter according to claim 1, wherein the tapered protuberances provided per each of said loops are essentially embodied with the same length.

18. A magnetic revolution counter according to claim 1, wherein the electrical contact arrangements are provided on both sides of a single tapered one of the tapered protuberances at a pre-specifiable interval for determining the electrical resistance.

19. A magnetic revolution counter according to claim 1, wherein the contact arrangements are provided on both sides of each of said tapered protuberances at a pre-specifiable interval for determining the electrical resistance.

20. A magnetic revolution counter according to claim 18, wherein, in addition to the contact arrangements, in the area of the one tapered protuberance, additional contact arrangements are provided therein, said one tapered protuberance then being embodied longer in comparison to the length of others of the tapered protuberences.

21. A magnetic revolution counter according to claim 19, wherein, in addition to the electrical contact arrangements, in the area of each of the tapered protuberances, additional contact arrangements are provided within each protuberance.

22. A magnetic revolution counter according to claim 18, wherein only eight contact arrangements are provided for each of the sensor elements.

23. A magnetic revolution counter according to claim 20, wherein only eight contact arrangements are provided for each of the sensor elements.

24. A magnetic revolution counter according to claim 19, wherein at least 2n number of the contact arrangements are provided for each loop shaped sensor element.

25. A magnetic revolution counter according to claim 21, wherein at least 2n number of the contact arrangements are provided for each loop shaped sensor element.

26. A magnetic revolution counter according to claim 1, wherein at least 4n contact arrangements are provided for each of said sensor elements when it is to be possible to eliminate the effects of hysteresis during use of only one revolution counter.

27. A magnetic revolution counter according to claim 1, wherein the loop shaped sensor elements are formed by a GMR layer system.

28. A magnetic revolution counter according to claim 27, wherein the actual soft magnetic layer that guides the magnetic domains is formed within the GMR layer system by a NiFe layer, a CoFeNi alloy layer or another soft magnetic alloy layer that has a thickness in the range of 5 nm to 40 nm and a width between 50 nm and 400 nm.

29. A magnetic revolution counter according to claim 1, wherein the each of the sensor elements is formed by a soft magnetic layer that is provided with TMR stacks of layers.

30. A magnetic revolution counter according to claim 29, wherein the soft magnetic layer includes an NiFe layer, a CoFeNi layer or another soft magnetic layer.

31. A magnetic revolution counter according to claim 29, wherein the contact arrangements are simultaneously formed by the TMR stack of layers.

32. A magnetic revolution counter according to claim 1, wherein wedge shaped, rectified constrictions that permit only one movement direction for the domains, depending on orientation are provided in all straight segments of the sensor loops.

33. A magnetic revolution counter according to claim 5, wherein sensor elements are electrically connected directly to the substrate as part of a CMOS circuit.

34. A magnetic revolution counter according to claim 6, wherein sensor elements are electrically connected directly to the substrate as part of a CMOS circuit.

* * * * *